United States Patent [19]

Mack

[11] Patent Number: 4,699,081
[45] Date of Patent: Oct. 13, 1987

[54] MEANS FOR DETECTING AND ADJUSTING METAL SALT CONCENTRATION IN AN ELECTROLESS PLATING BATH

[75] Inventor: Howard S. Mack, Bedford, Ohio
[73] Assignee: Harshaw/Filtrol Partnership, Cleveland, Ohio
[21] Appl. No.: 900,121
[22] Filed: Aug. 25, 1986
[51] Int. Cl.[4] ............................................. C23C 18/38
[52] U.S. Cl. .................................. 118/691; 118/610; 118/690; 427/8
[58] Field of Search ....................... 118/690, 691, 610
[56] References Cited

U.S. PATENT DOCUMENTS

| Re. 31,694 | 10/1984 | Slominsk | 118/690 |
| 3,934,054 | 1/1976 | Schmeling | 427/345 |
| 4,096,301 | 6/1978 | Slominski | 118/690 |
| 4,162,217 | 7/1979 | Herrmann | 427/345 |
| 4,353,933 | 10/1982 | Araki | 118/690 |
| 4,499,852 | 2/1985 | Castner | 118/690 |

*Primary Examiner*—John D. Smith
*Attorney, Agent, or Firm*—Harshaw/Filtrol Partnership

[57] ABSTRACT

An apparatus is described for the continuous monitoring of a solution such as an electroless nickel plating bath, and the routine adjustment of the bath during use. The apparatus comprises a probe adapted to be placed directly into the plating tank, and controller for means for replenishing nickel ions and other plating additives as they are depleted from the bath. The probe uses a light source for passing a beam of monochromatic light through a portion of the bath and a detector for measuring the intensity of the light. Means are used to prevent air and hydrogen bubbles in the bath from affecting the reliability of the measurements. Additional means are used for cooling of the electronics and the portion of the bath through which the light is directed.

17 Claims, 11 Drawing Figures

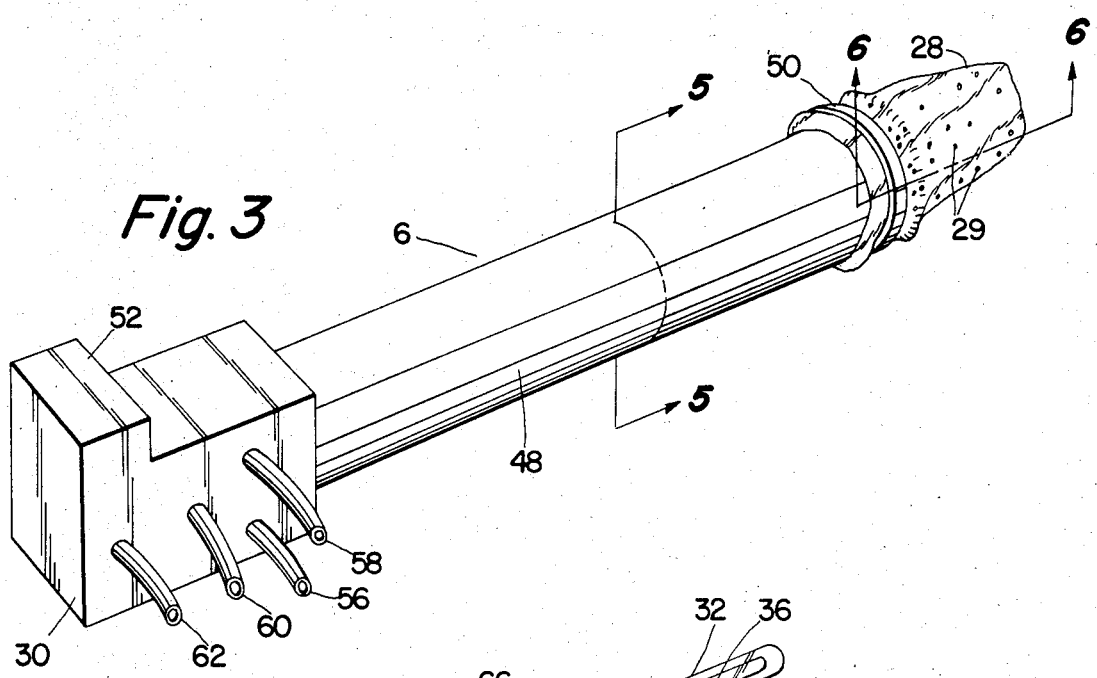
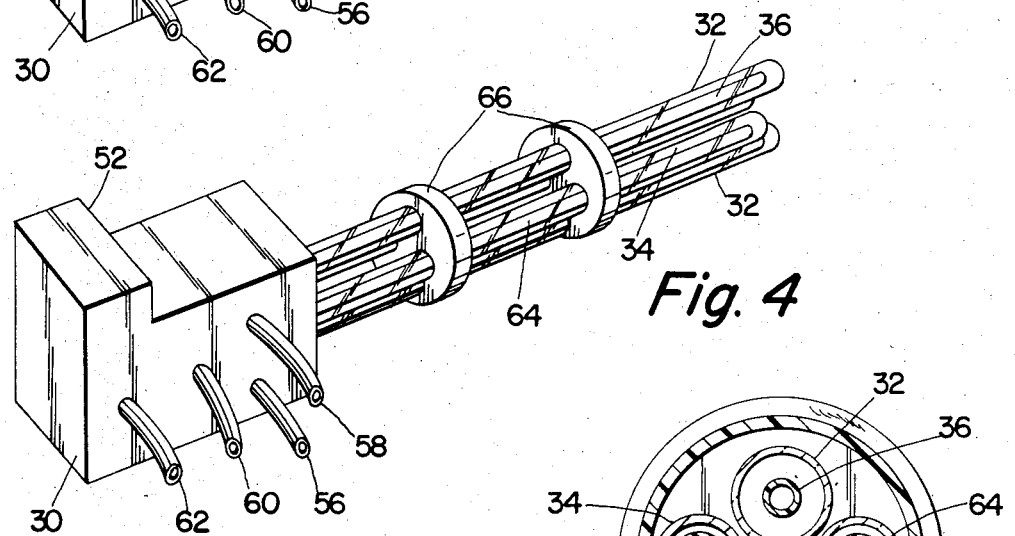
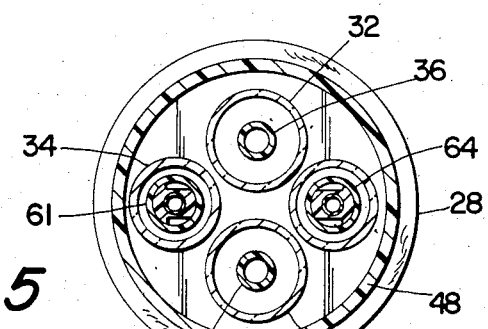
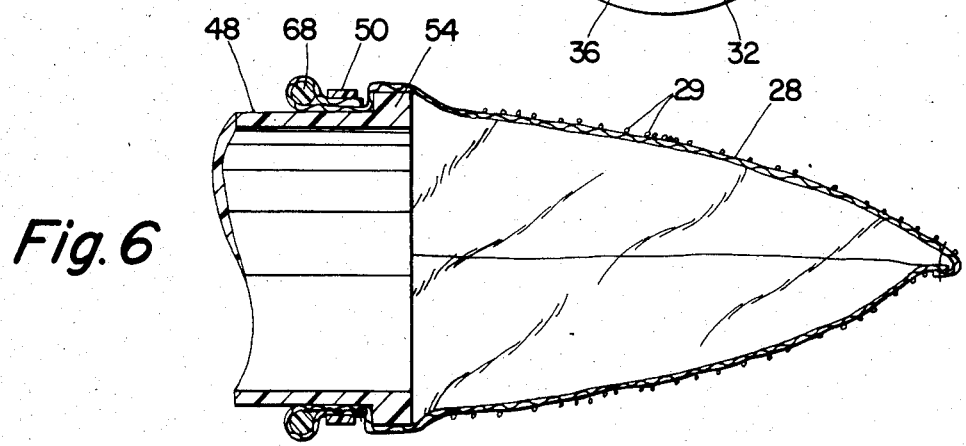

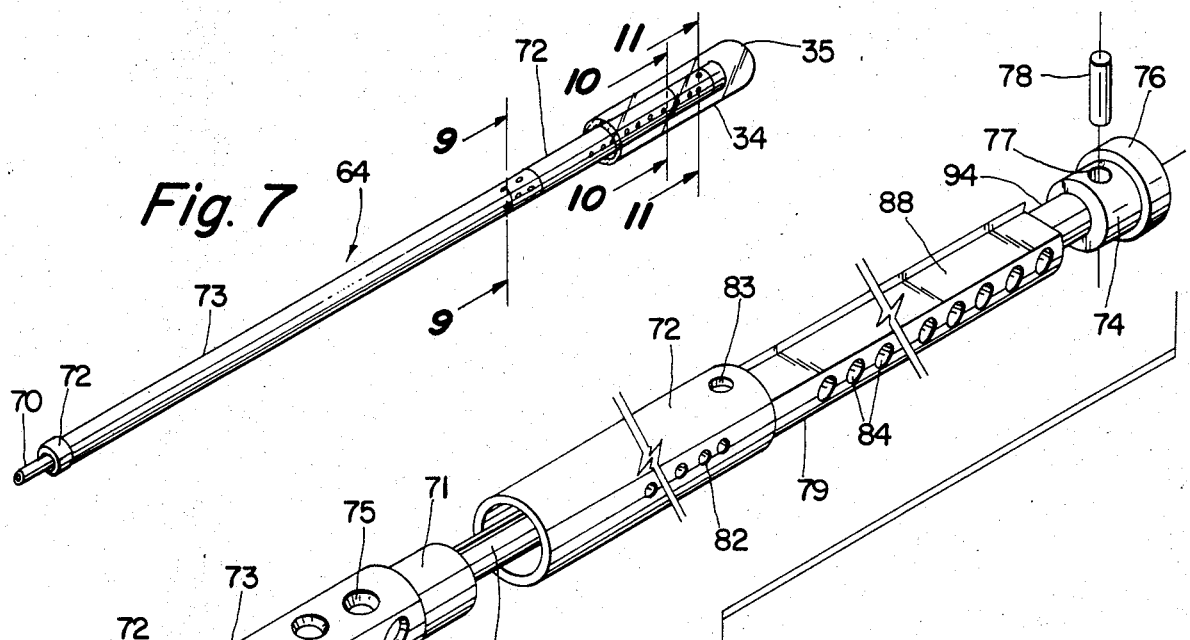
Fig. 7
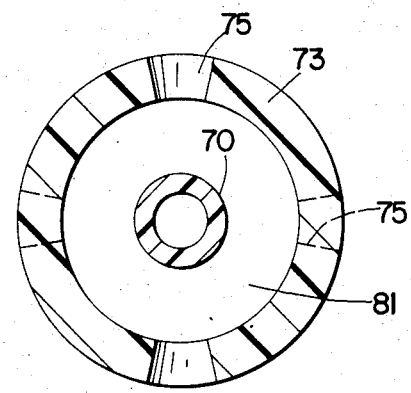
Fig. 8
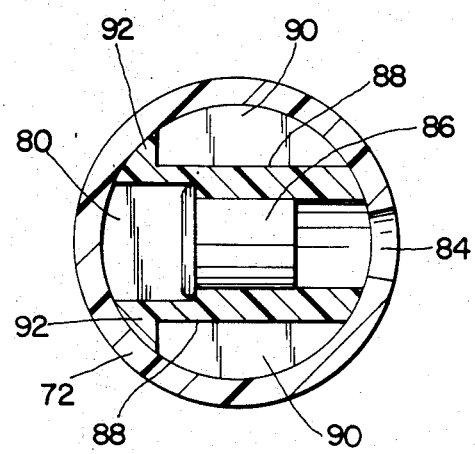
Fig. 9
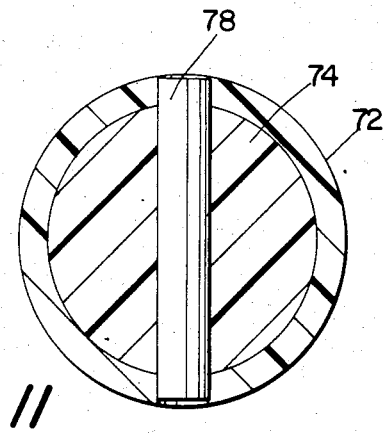
Fig. 10
Fig. 11

MEANS FOR DETECTING AND ADJUSTING METAL SALT CONCENTRATION IN AN ELECTROLESS PLATING BATH

BACKGROUND OF THE INVENTION

In recent years, the electroless plating of plastic parts and printed circuit boards has become a very common manufacturing process, typically involving a series of closely controlled processing steps. The actual step of plating from an electroless bath is typically carried out in a plating tank that is lined with plastic or stainless steel to make it non-catalytic to the plating solution. Inasmuch as most electroless baths are operated at elevated temperatures, the tank normally is equipped with means for heating the solution. An electroless plating bath requires frequent adjustment for consistent performance. Agitation of the bath is essential to insure renewal of the plating solution in contact with the surface being plated. Careful cleaning and conditioning of the parts to be plated is also very essential to avoid misplate and unevenness in the thickness of the plate. The bath is filtered continuously or periodically to remove impurities and metal particles that may seed out from solution.

The plating bath requires replenishment of the solution, typically by the addition of a mixture of correctly apportioned ingredients, including the metal salt, reducing agent, stabilizers and brighteners. This may require extensive monitoring of the bath, accompanied by the manual addition of the chemicals to the bath. Various automatic regulators have been developed, but these typically use test equipment which measures the pH of the bath or the concentration of metal ions in the bath and makes adjustments based on these measurements. Normally the testing involves removing a small portion of the bath from the plating tank, measuring the pH or metal concentration in the removed portion perhaps preceded by coating, diluting, buffing, etc., and then returning the test sample to the bath.

In the recent past, one method of monitoring electroless copper baths has been to use an in-tank optical sensor to detect changes in the transmissibility of the plating bath. As the copper ions in a bath become depleted, the bath becomes less opaque resulting in an increase in the amount of light that passes between a light source and a detector, spaced a fixed distance apart. The change in light detection can be used to activate a pump or other device to transfer addition agents into the plating tank. Because electroless copper plating is normally carried out at a temperature of 140° F. or below, such a monitoring device is relatively simple.

On the other hand, other electroless plating baths such as chromium, cobalt, gold, iron and nickel are run at temperatures between 170° F and 205° F., accompanied by the high degree of agitation and the rapid evolution of hydrogen gas at these elevated temperatures. The in-tank probes used to monitor copper electroless plating baths have been found to be totally inadequate for controlling the addition of metals salts, reducing agents and pH adjusters in these heated plating baths. U.S. Pat. No. 4,096,301 (Re 31,694) describes one method of controlling an electroless copper bath by withdrawing a sample of the bath at a constant rate and subjecting the sample to three separate sequential analyses to test for pH and for concentrations of copper and formaldehyde. Fresh solutions are metered into the bath to adjust for pH and to replenish the depleted chemicals. U.S. Pat. No. 4,479,852 describes a method of monitoring organic additives in an acid copper plating bath. The method involves plating onto a cathode at constant current density and voltage, followed by immersing the plated cathode into the bath along with a reference electrode and an anode, passing a current at a constant current density from the anode to the cathode, and measuring the voltage difference between the reference electrode and the cathode. The measured voltage differences are then compared with previously determined values of known concentrations.

BRIEF DESCRIPTION OF THE PRESENT INVENTION

The present invention relates to a method and apparatus for detecting variations in the concentration of metal in an electroless plating bath comprising the steps of (a) removing entrained bubbles from a portion of the plating bath; (b) passing that portion of the bath between a light source and a light detector spaced at a fixed distance from one another; (c) generating a signal based upon the intensity of light passing through the solution from the light source to the detector, and; (d) comparing the signal with at least one predetermined limit to determine whether the signal is greater than, equal to, or less than the limit, thereby indicating whether the metal concentration is above, at, or below a selected prescribed value. The invention also covers the added step of regulating the concentration of metal and reducing agent in the bath by using the signal comparison to control a device for feeding additional metal salts and reducing agents and other additives as needed into the bath when the signal indicates that the concentration of soluble metal ions in the bath is below that required for optimum operation of the bath.

An apparatus is described for detecting variations in the concentration of the bath and for controlling the amount of metal salts and reducing agents to maintain the bath in an operational mode. The apparatus comprises a probe which is placed in the plating tank and which includes a light source and a detector, means for shielding the light source and detector from extraneous light, means for removing entrained bubbles from the portion of the plating bath passing between the light source and detector, means for maintaining that portion of the plating bath at a constant temperature, slightly below the operational temperature of the bath and means for detecting variations of intensity of light passing from the light source to the light detector, thereby indicating a change in concentration from metal salts in the bath. The apparatus also includes controller means for regulating the amount of metal salts and reducing agent to be added to the bath to restore the concentration in the bath to optimum levels.

BRIEF DESCRIPTION OF THE DRAWINGS

FIG. 3 is a perspective view of the probe assembly.

FIG. 4 is another perspective of the probe, partially disassembled.

FIG. 5 is a cross-sectional view of the probe taken along lines 5—5 of FIG. 3.

FIG. 6 is a cross-sectional view of the bubble entrainment filter taken along lines 6—6 of FIG. 3.

FIG. 7 is a perspective view of one of the light detector rods contained within the probe.

FIG. 8 is an exploded, enlarged perspective of the light detector rod of FIG. 7.

FIG. 9 is a cross-sectional view of the rod taken along lines 9—9 of FIG. 7.

FIG. 10 is a cross-sectional view of the rod taken along lines 10—10 of FIG. 7, and FIG. 11 is a cross-sectional view of the light detection rod taken along lines 11—11 of FIG. 7.

DETAILED DESCRIPTION OF THE INVENTION

Figure 1:
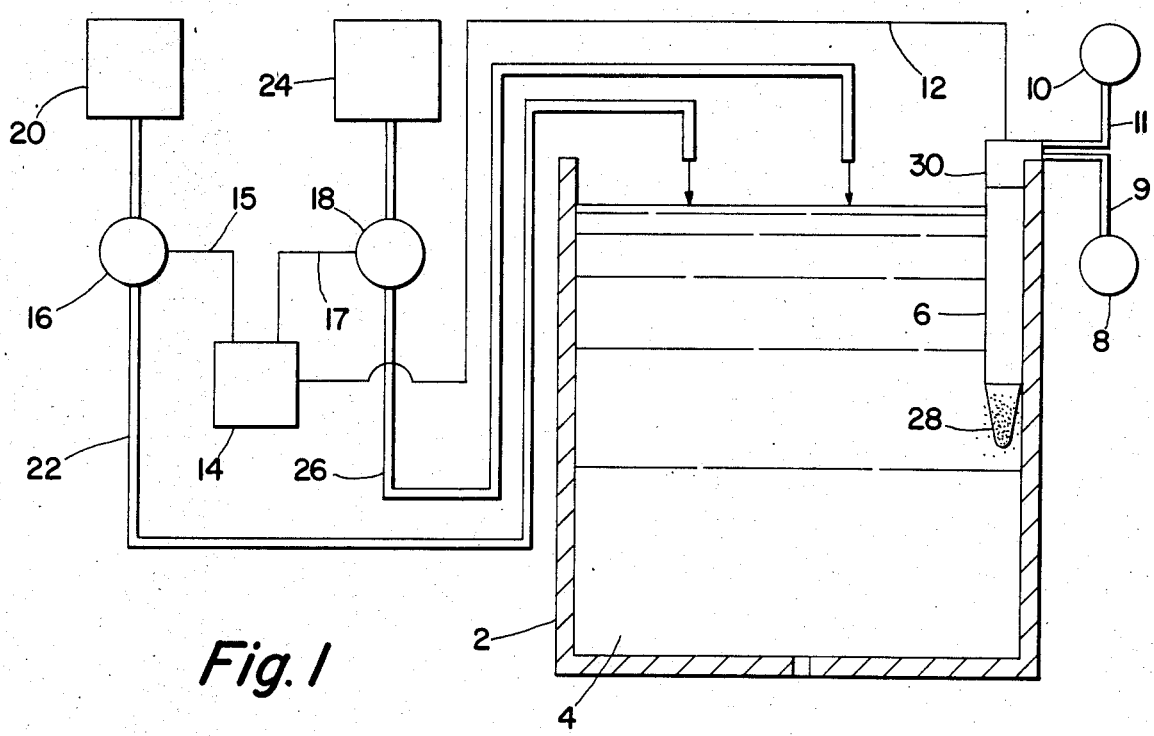
FIG. 1 is a schematic showing the probe of the present invention, positioned within a plating tank, and showing the controller, the pumps and the containers for supply and replenishment of chemicals to the plating bath.

This invention relates to a method and apparatus for continuously monitoring the concentration of metal salts in a heated electroless plating bath, particularly a bath that has considerable amounts of bubbles entrained in the bath, caused by air or mechanical agitation, hydrogen gas evolution or both. Although the invention is applicable to any heated electroless bath that undergoes a detectable change in light transmission as the metal is consumed, it will be described with particular reference to an electroless nickel bath.

A nickel bath can be formulated either as an acid bath or as an alkaline bath. An acid bath has a composition typically as follows:

Nickel sulfate—30 g/l
Sodium glycollate—50 g/l
Sodium hypophosphite—10 g/l and is operated at a temperature of 190°-200° F. at a pH in the range of 4 to 6 to give a deposition rate up to 0.6 mil/hr.

The following is a typical composition for an alkaline bath:

Nickel chloride—30 g/l
Sodium citrate—100 g/l
Ammonium chloride—50 g/l
Sodium hypophosphite —10 g/l This bath has a pH of 8-10 and gives a plating rate of about 0.3 mil/hr when operated at a bath temperature of 190° F.

According to the present invention, control of variations in the concentration of nickel or other metallic ion in a heated electroless plating bath involves the following steps:

1. Removing substantially all of the entrained bubbles from a portion of the plating solution in the tank.

2. Passing that portion of the solution between a light source and a light detector spaced a given distance from one another.

3. Generating a signal based upon the intensity of light in a given wave band passing through the solution from the light source to the detector, said intensity being inversely proportional to the concentration of metal ions in the solution.

4. Comparing the signal with at least one predetermined limit to determine whether the signal is greater or less than the limit thereby indicating whether the dissolved metal concentration is above or below a prescribed value.

The portion of the bath which passes between the light source and the detector is preferably cooled to a temperature at which autodeposition of the metal does not occur. For a nickel plating bath that is operated at 190° F., the temperature is dropped at least 10° F. and preferably 20° F. or more to a temperature of 180° F. or less.

Hydrogen gas bubbles are constantly being generated in an electroless plating bath as the metal is being reduced by the reducing agent. At elevated temperatures, the evolution of hydrogen gas is even more pronounced.

The entrained air and hydrogen gas bubbles are removed by passing a portion of the solution through a filter capable of screening out the air bubbles to prevent them from passing through the optical sensor and distorting the transmission characteristics of the bath. A fine mesh screen or bag having a pore size selected in the range of 1 to 50 millimeters (microns), preferably 10 to 25 millimeters has been found to work satisfactorily in removing the entrained bubbles.

The use of a light source that emits light in a specific range of wavelengths is an important aspect of the present invention. Because an electroless nickel sulfate bath is green, it tends to absorb a substantial amount of light in the infra-red band of the light spectrum around 640 nm. Therefore, a light emitting diode capable of emitting light in that region would normally be used. When the plating solution is fresh, the amount of light passing through the solution to the detector is small, but as the nickel ions in the bath become depleted, the intensity of light reaching the photodetector increases.

The signal that is generated by changes in the intensity of light passing through the plating bath can be used to activate and regulate valves and/or pumps to feed additional quantities of metal salts and reducing agents to the plating bath. The amount being added can be preset, or can be controlled by a closed loop system which terminates the addition when the optical sensor determines by light transmission that the metal concentration is at the proper level. The method can be used to control the addition of the metal salt by itself or along with the reducing agent and/or with an acid or a base to adjust pH of the bath.

In FIG. 1 is shown a plating tank 2, typically having a capacity of 50 to 1000 gallons of plating solution 4 which, for purposes of this description, is an electroless nickel plating bath. Mounted on the side of the tank and extending into the bath is an in-tank probe 6 adapted to detect changes in the concentration of metal salts in the bath. A source 8 of cooling water and an air supply source 10 feed water and air to the probe 6 through lines 9 and 11. Signals are transmitted via cable 12 to a controller 14 which in turn sends a signal through line 15 to pump 16 to cause additional metal salt to be pumped from container 20 through line 22 to tank 4 to replenish the salts as they are consumed during use. In like manner, the controller 14 sends a signal via line 17 to pump 18 to cause additional hypophosphite to be pumped from container 24 through line 26 to the plating tank to replace the reducing agent as consumed. It should be understood that the reducing agent typically is consumed at the same rate as the metal salt in which case one pump such as a single motor-double headed bellows pump may be used to simultaneously pump both solutions into the tank. It should also be noted that the controller can be used to regulate the addition of accelerators, buffers and other agents to the bath.

Figure 2:
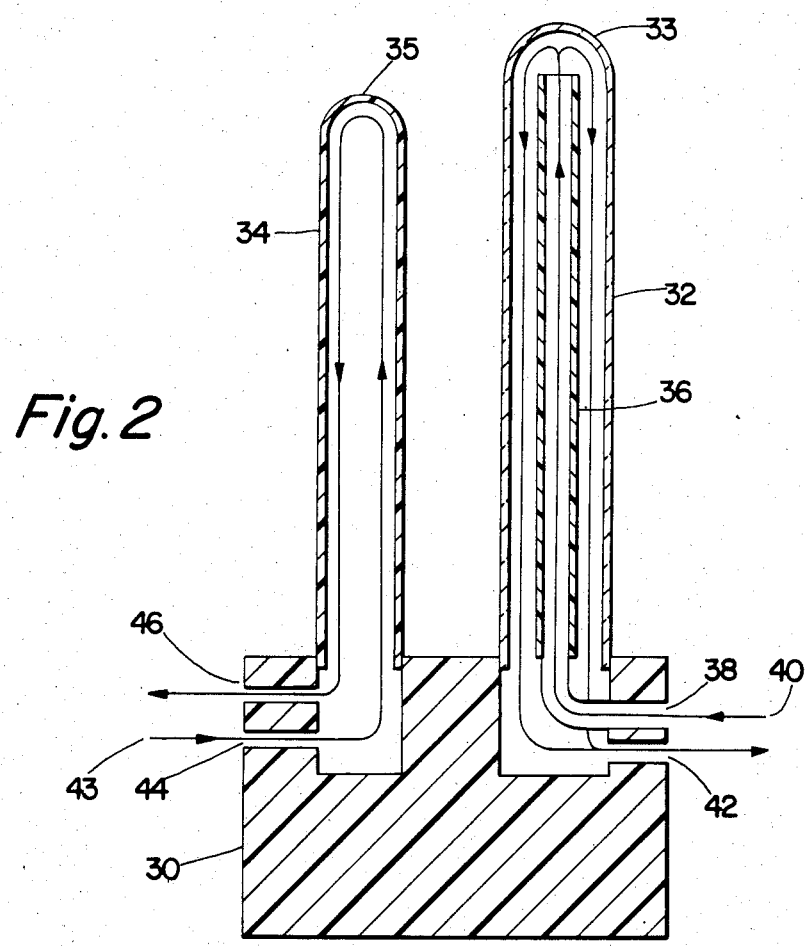
FIG. 2 is a simplified schematic diagram in cross-section showing means for controlling the temperature of the probe.

Referring now to FIG. 2, there is shown a simplified flow diagram for the water and air feed to the probe from the respective supply sources 8 and 10 shown in FIG. 1, noting that the diagram shows the schematic arrangement upside down from how it would be if mounted on a plating tank. Within the probe are tubes, two of which 32, 34 are shown. Tube 32 is a cooling tube and is shown as being slightly longer than tube 34 which is transparent and which contains a light source or detector. One end of each tube is snugly fitted into the head, using one or more O-rings (not shown) or a suitable adhesive, and the other end 33, 35 is closed as shown. Within cooling tube 32 is a tubing 36 connected to water inlet 38 and terminating near the closed end 33 of the glass tube. Water inlet is connected to a water supply line (not shown). Cooling water 40 flowing through the tubing 36 to the closed end 33 of the tube 32 returns along the wall of the tube to the discharge 42, thereby effectively cooling the tube and the surroundings in the process. Depending on design parameters, economics and the amount of cooling required, air or other coolants and refrigerants may be used instead of water.

In a similar manner, an optically transparent tube 34, which contains a light source or light detector, (not shown), is cooled, but because of the presence of electronics, air rather than water is used for cooling. The air 43 enters inlet 44 and passes through and around the electronic assembly and flows out through outlet 46. The air passages will be shown in greater detail in FIG. 7.

Referring now to FIGS. 3 and 4, the probe 6 includes a head 30, an optically opaque housing 48 and air entrainment separator 28 shown as a bag clamped to the housing by a retainer strap 50. The head is designed to provide a shoulder 52 which rests or is fastened on the rim or upper edge of a plating tank thereby permitting the probe housing to be immersed in the plating solution. On the outside of the air separator 28 are shown metallic particles 29 which tend to accumulate on its outer surface.

FIG. 4 shows the probe with the housing and bag removed, exposing portions of four closed end glass tubes, including two water cooled tubes 32, and two air cooled tubes 34 which are slightly shorter than the water cooled tubes and which contain electronic light sensors. Tubing 36 carries water to cool tubes 32. A light rod 64 is disposed in each of the shorter tubes 34, one rod adapted to transmit, and the other to detect, light.

The glass tubes are held in fixed spaced relationship with one another by a pair of mounting rings 66, typically machined from plastic or hard rubber. If necessary, the rings can be secured to the head 30 by one or more connecting rods, not shown. The two shorter tubes 34 are typically spaced apart a distance or between $\frac{1}{8}$ inch and 4 inches, preferably between $\frac{1}{4}$ inch and 1 inch. FIGS. 3 and 4 show several lengths of tubing 56, 58, 60 and 62 joined to the head for the purpose of circulating cooling water and air through the probe.

The cross-sectional view of FIG. 5 along lines 5—5 of FIG. 3 shows in greater detail the arrangement of the glass tubes within the probe housing 48. The two cooling tubes 32 each contain tubing 36 which provides cooling water to maintain a temperature stable environment within the probe housing. The other two tubes 34 each contain a light rod 64, the details of which will be explained in greater detail hereinafter.

FIG. 6 shows in greater detail the air entrainment separator 28, pictured here as a bag, made from a suitable material such 25 as polypropylene. The bag has an opening which is defined by a bead ring 68, and the bag is held in place by retainer strap 50 and a lip 54 welded or otherwise secured to the end of the housing 48. It has been found that a Micron-Rated Filter Bag sold by American Felt & Filter Company having a nominal pore size of 25 (microns) adequately prevents particles 29 of metal and air bubbles from interfering with the probe optics. Smaller pore sizes down to 1 $\mu$m may be used, depending on the degree of $H_2$ evolution and amount of agitation that is used in the bath.

Details of the two light rods are shown in FIGS. 7-11. As previously mentioned, each of these rods 64 is adapted to fit into a glass tube 34, the end portion of which is shown in FIG. 7. As noted in FIG. 8, the left end of the rod is fitted with a collar 72 which fits snugly into a drilled or machined recess in the probe head. The other end of the rod terminates in proximity to the closed end 35 of the tube 34. Tubing 70 supplies cooling air to the light rod. The rod includes an upper rod assembly 73 and a lower detector assembly containing the electronics fitted within a circular sleeve 72. Although the construction of the two light rods are similar, it is understood that one of the rods contains the light source and the other rod contains the light detection means.

The exploded view of the light rod shown in FIG. 8 reveals in greater detail the passage of air to enable the rod to be continuously cooled during operation. Air at about 7 lbs. pressure enters through tubing 70 and flows into a channel or slot 80 (shown in FIG. 10) extending the length of detector assembly 79. The air removes heat generated by the light emitting sources (shown as diodes 86 in FIG. 10) or light detecting means and flows to the neck 94 at the end of the detector assembly. With coupling sleeve 72 secured in place with pin 78, pressed through holes 83 and 77, the air reverses direction and flows back up the rod through two channels 90 (FIG. 10) formed by the sleeve 72 and the plateaus 88 and lips 92 machined or otherwise formed in the detector assembly. From the lower detector assembly, the air flows into the annular space 81 (shown in FIG. 9) between the air tube 70 and the upper rod assembly 73. The coupling sleeve 72 extends from the shoulder portion 71 of the upper rod assembly 73 to the end cap 74. The air passes radially out through the air holes 75 and exits the probe in the annular space between the assembly 73 and the glass tubing 34. It should be noted that other coolants and low pressure refrigerants, inert gases and cooling water can be used to cool the electronics, with appropriate care being taken to be sure that the optics are sealed to protect them from damage.

The sleeve 72 contains apertures 82 which coincide with light holes 84 when the sleeve is positioned over the detector assembly 79. Appropriate means may be provided for changing the size of the openings in the apertures, thereby controlling the amount of light transmission through the plating solution. Alternatively, or in addition thereto, the light intensity can be varied by use of a rheostat mounted in the head of the probe, or on the controller, capable of varying the current from 0 to 50 microamps to the LED and the photocell.

The probe operates in a manner that provides continuous monitoring and regulation of the electroless plating bath, thereby prolonging the operation of the bath, reducing downtime and service time and increasing the throughput and the quality of the deposits. Many modifications can be made in the placement and locations of the light sources and detectors, the means of maintaining the probes at a constantly cooled temperature and, the method of removing air bubbles to maintain the sensitivity of the device without departing from the present invention.

Although the selection of specific components for use with this invention is not critical, it has been found that a suitable diode is a 153UR light bulb supplied by A N D. and designed to emit light at 640 nm. The light intensity can be detected by use of a VT241 Cadmium selenium diode having 2 foot candles of resistance. Such a device is sold by Vactec, Inc.

Although a diode emitting in the region of 640 nm has been found to be satisfactory for use in electroless nickel baths, diodes having a steady light output in the range of 640 to 900 nm may be used on other electroless plating baths and other types of solutions which undergo a change in color intensity in use, thereby generating a measurable change in light transmission through the bath.

Instead of steady light sources, pulsed sources may be employed for the same purpose. They can be used to develop higher light output, while at the same time, running cooler than bulbs supplying a steady source of light.

I claim:
1. An in-tank probe comprising
   (a) a light source and a light detector spaced apart from one another
   (b) a housing to contain the light source and detector and to eliminate extraneous light
   (c) means for removing entrained bubbles from a portion of an electroless plating bath while permitting the bath to continuously enter the housing through an inlet
   (d) means for maintaining the plating bath within the housing at a uniform temperature less than the operating temperature of the plating bath, and
   (e) sensing means for determining changes of the intensity of a light passing from the light source being detected by the light detector.

2. The probe of claim 1 wherein the means for removing entrained bubbles comprises a filter having a pore size that is large enough to permit the passage of plating bath but is small enough to prevent a substantial portion of the bubbles from passing therethrough.

3. The probe of claim 2 wherein the filter has a pore size of between about 1 and about 50 micrometers.

4. The probe of claim 3 wherein the filter consists of a polypropylene bag which encloses the inlet to the housing.

5. The probe according to claim 4 wherein the light source comprises a plurality of discreet light emitting diodes, and the light detecting means comprise an equal number of photodetectors all spaced an equal distance from the diodes, each detector positioned to record the light output from one diode.

6. The probe of claim 5 wherein the diodes are enclosed in a first closed optically transparent tube and the photodetectors are enclosed in a second closed optically transparent tube parallel to and spaced apart from the first tube.

7. The probe of claim 6 wherein the optically transparent tubes are glass tubes and the tubes are spaced a distance of between about 150 inches and about 4 inches from one another.

8. The probe of claim 7 wherein the two glass tubes are spaced a distance of between ¼" and 1" from one another.

9. The probe of claim 8 wherein the diodes and detectors are air cooled.

10. The probe of claim 9 wherein circulating water is used as as cooling means to cool the plating solution within the housing and to maintain the plating bath within the housing at a uniform temperature less than the operating temperature of the plating bath.

11. The probe of claim 10 wherein the cooling means comprises a pair of cooling tubes closed at one end and positioned in parallel spaced apart relationship to the glass tubes containing the diodes and photodetectors, said cooling tubes containing means for circulating water through each tube.

12. A device for monitoring the concentration of nickel ions in an electroless nickel plating bath comprising
   (a) an opaque cylindrical housing adapted to contain a light detector and a light emitting device
      1. one end of the housing being open and covered by a filter and adapted to be immersed in a plating bath
      2. the other end of the housing adapted to receive and introduce cooling means into the housing
   (b) a light detector positioned within the housing and comprising at least one photo diode, said detector enclosed within a first optically transparent tube being closed at one end
   (c) a light source positioned within the housing at a fixed distance from the light detector and comprising at least one light emitting diode, said device contained within a second optically transparent tube being closed at one end
   (d) means for cooling the light detector and light emitting diode, said means comprising inlets for introducing cooling air into the transparent tubes to cool said light source and said detector
   (e) means for introducing a portion of the plating bath through the filter into the housing between the two transparent tubes, and
   (f) means for signalling a change in the intensity of light passing from the diode through the bath to the detector thereby indicating a change in the optical transmissibility of the solution.

13. The device as described in claim 12 wherein the light source comprises a plurality of light emitting diodes mounted in a first elongated annular light rod, said rod centered within said first transparent tube, and the light detector comprises a plurality of discrete detectors corresponding in number to the number of diodes and mounted on a second elongated annular light rod centered within the said second transparent tube.

14. The device of claim 13 including means for introducing air into the open end of each of the transparent tubes, and for causing the air to flow through the annular light rod and across the diodes and detectors to the end of the light rod.

15. The device of claim 14 including means for reversing the flow of air when it reaches the end of each light rod to provide additional cooling of the light rod as the air passes out of the open end of the transparent tube.

16. The device according to claim 15 including means for introducing a cooling fluid into the housing to reduce the temperature of the plating bath entering the housing, said means comprising at least one closed end tube extending into the housing a distance at least coextensive to that with the length of said transparent tubes, and means for introducing the cooling fluid into the bottom of the tube at the closed end and causing the fluid to flow to the open end of each tube.

17. The device of claim 16 including means for removing entrained bubbles comprising a filter having a pore size that is large enough to permit the passage of plating bath but is small enough to prevent a substantial portion of the bubbles from passing therethrough, said filter having a pore size of between about 10 and about 25 micrometers.

* * * * *